United States Patent
Wang et al.

(10) Patent No.: US 8,629,518 B2
(45) Date of Patent: Jan. 14, 2014

(54) SACRIFICE LAYER STRUCTURE AND METHOD FOR MAGNETIC TUNNEL JUNCTION (MTJ) ETCHING PROCESS

(75) Inventors: Yu-Jen Wang, Hsinchu (TW); Ya-Chen Kao, Hsinchu (TW); Chun-Jung Lin, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 266 days.

(21) Appl. No.: 12/828,593

(22) Filed: Jul. 1, 2010

(65) Prior Publication Data

US 2011/0001201 A1 Jan. 6, 2011

Related U.S. Application Data

(60) Provisional application No. 61/222,838, filed on Jul. 2, 2009.

(51) Int. Cl.
*H01L 29/82* (2006.01)

(52) U.S. Cl.
USPC ........... 257/421; 257/422; 257/423; 257/424; 257/425; 257/426; 257/427; 257/E29.323; 438/3; 365/157; 365/158

(58) Field of Classification Search
USPC ............. 257/421–427, E29.323; 438/3; 360/324–326; 365/157–158
See application file for complete search history.

(56) References Cited

U.S. PATENT DOCUMENTS

| | | | | |
|---|---|---|---|---|
| 5,640,343 A | * | 6/1997 | Gallagher et al. | 365/171 |
| 5,793,697 A | * | 8/1998 | Scheuerlein | 365/230.07 |
| 6,052,263 A | * | 4/2000 | Gill | 360/324.11 |
| 6,845,038 B1 | * | 1/2005 | Shukh | 365/171 |
| 2001/0005301 A1 | * | 6/2001 | Komuro et al. | 360/324.2 |
| 2005/0002229 A1 | * | 1/2005 | Matsutera et al. | 365/171 |
| 2005/0277206 A1 | * | 12/2005 | Gaidis et al. | 438/3 |
| 2008/0055792 A1 | * | 3/2008 | Zheng et al. | 360/324.2 |
| 2009/0040663 A1 | * | 2/2009 | Lee et al. | 360/324.12 |
| 2009/0218645 A1 | * | 9/2009 | Ranjan et al. | 257/421 |

* cited by examiner

*Primary Examiner* — Jami M Valentine
(74) *Attorney, Agent, or Firm* — Lowe Hauptman & Ham, LLP

(57) ABSTRACT

A magnetic tunnel junction (MTJ) etching process uses a sacrifice layer. An MTJ cell structure includes an MTJ stack with a first magnetic layer, a second magnetic layer, and a tunnel barrier layer in between the first magnetic layer and the second magnetic layer, and a sacrifice layer adjacent to the second magnetic layer, where the sacrifice layer protects the second magnetic layer in the MTJ stack from oxidation during an ashing process. The sacrifice layer does not increase a resistance of the MTJ stack. The sacrifice layer can be made of Mg, Cr, V, Mn, Ti, Zr, Zn, or any alloy combination thereof, or any other suitable material. The sacrifice layer can be multi-layered and/or have a thickness ranging from 5 Å to 400 Å. The MTJ cell structure can have a top conducting layer over the sacrifice layer.

20 Claims, 3 Drawing Sheets

SACRIFICE LAYER STRUCTURE AND METHOD FOR MAGNETIC TUNNEL JUNCTION (MTJ) ETCHING PROCESS

CROSS-REFERENCE TO RELATED APPLICATIONS

The present application claims priority of U.S. Provisional Patent Application Ser. No. 61/222,838, filed on Jul. 2, 2009, which is incorporated herein by reference in its entirety.

TECHNICAL FIELD

This disclosure relates generally to integrated circuit etching processes, more particularly magnetic tunnel junction (MTJ) etching processes.

BACKGROUND

In Magnetoresistive Random Access Memory (MRAM), data is stored by magnetic storage elements. The elements are formed from two ferromagnetic layers, each of which can hold a magnetic field, separated by a thin tunnel barrier layer. One of the two layers is a permanent magnetic layer set to a particular polarity; the other's field will change to match that of an external field. A memory device is built from a grid of such cells.

Reading is accomplished by measuring the electrical resistance of the cell. A particular cell is typically selected by powering an associated transistor that switches current from a supply line through the cell to ground. Due to the magnetic tunnel effect, the electrical resistance of the cell changes due to the orientation of the moments in the two magnetic layers. By measuring the resulting current, the resistance inside any particular cell can be determined, and from this the polarity of the writable layer. Typically if the two layers have the same polarity this is considered to mean "0", while if the two layers are of opposite polarity the resistance will be higher and this means "1".

Magnetic tunnel junctions (MTJs), a component in MRAM, include two ferromagnets (magnetic layers) separated by a thin tunnel barrier layer (dielectric tunneling layer) as described above. MTJs are manufactured using thin film technology and prepared by photolithography. The first magnetic layer is referred to as a fixed/pinned layer because its magnetic polarity is fixed, while the second layer is referred to as a free layer because its magnetic polarity changes when the magnetic cell is written to. On top of the free layer, typically a conductive top conducting layer provides thermal and magnetic stability for the MTJs.

For MRAM processes, especially 65 nm and/or 45 nm process and beyond, an important issue is the oxidation of the MTJ free layer (i.e. a dead layer) that impacts the free layer performance and the etching uniformity. The free layer is oxidized during the photoresist ashing process. Ashing process is the removal of organic materials, e.g. photoresist, by volatilization from the wafer surface using strongly oxidizing ambient; e.g. oxygen plasma ashing. However, $O_2$ ashing will also oxidize the free layer.

Another issue is the total resistance through the top conducting layer and free layer, because with increased resistance, the writing voltage needs to be also increased. This situation is not desirable for MRAM, and especially not suitable for spin-torque-transfer (STT)-MRAM for example. Accordingly, new methods to decrease the dead layer in MTJ free layer, not increase the total resistance of MTJ, and increase the yield of MRAM cell are desired.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the invention.

A structure and method for magnetic tunnel junction (MTJ) etching process using a sacrifice layer are provided. The sacrifice layer will not form a dense oxide layer even after the etching process, and the total resistance will not be increased, thus the writing voltage will not be increased. Also, the MTJ with a sacrifice layer will increase yield dramatically, especially for STT-MRAM. Throughout the various views and illustrative embodiments of the present disclosure, like reference numbers are used to designate like elements.

Figure 1:
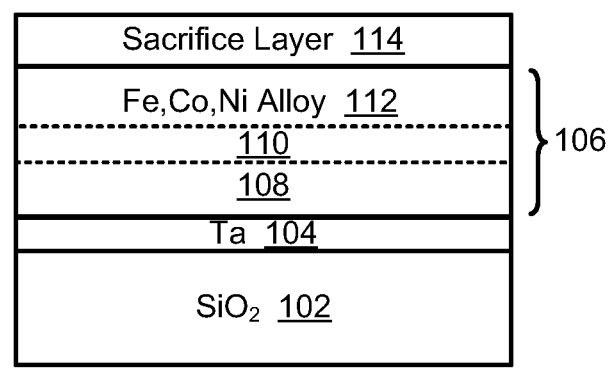
FIG. 1 illustrates an example embodiment of an MTJ cell structure according to one aspect of the disclosure.

FIG. 1 illustrates an example embodiment of an MTJ cell structure according to one aspect of the disclosure. The MTJ film deposition can be done by magnetron sputter deposition, molecular beam epitaxy, pulsed laser deposition, electron beam physical vapor deposition or ion beam deposition. In the example of FIG. 1, there are an insulating layer 102 (e.g. $SiO_2$), a bottom conducting layer 104 (e.g. Ta), an MTJ 106 including a pinned (e.g. Fe/Co/Ni alloy layer) & pinning layer (e.g. PtMn) 108, a tunnel barrier layer 110 (e.g. MgO or $Al_2O_3$), a free layer 112 (e.g. Fe/Co/Ni alloy layer), and a sacrifice layer 114. The bottom conducting layer 104 is a bottom electrode for conducting to metal layer (e.g. Cu). The pinning layer is antiferromagnetic material (e.g. PtMn) between the pinned layer and the bottom conducting layer 104. A top conducting layer can be deposited on top of the sacrifice layer prior to further processing, e.g. photolithography, etching, ashing, etc.

The sacrifice layer 114 materials can have smaller electronegativity than the free layer 112 of a MTJ cell. The sacrifice layer 114 can protect the free layer 112 from oxidation during an ashing process, and the free layer 112 can be Fe/Co/Ni alloy that may react easily with oxygen. The sacrifice layer 114 can be metallic, e.g. Mg, Cr, V, Mn, Ti, Zr, Zn, any alloy combination of them, or any other suitable material. As a result, the total resistance will not be increased, thus the writing voltage will not be increased. The sacrifice layer 114 is not limited to a single film, but instead can have a multilayer film structure and can be composed of several film structures. For example, the sacrifice layer 114 can be a Mg/Mn multilayer. The Sacrifice layer thickness can ranges from 5 Å to 400 Å.

Figure 2:
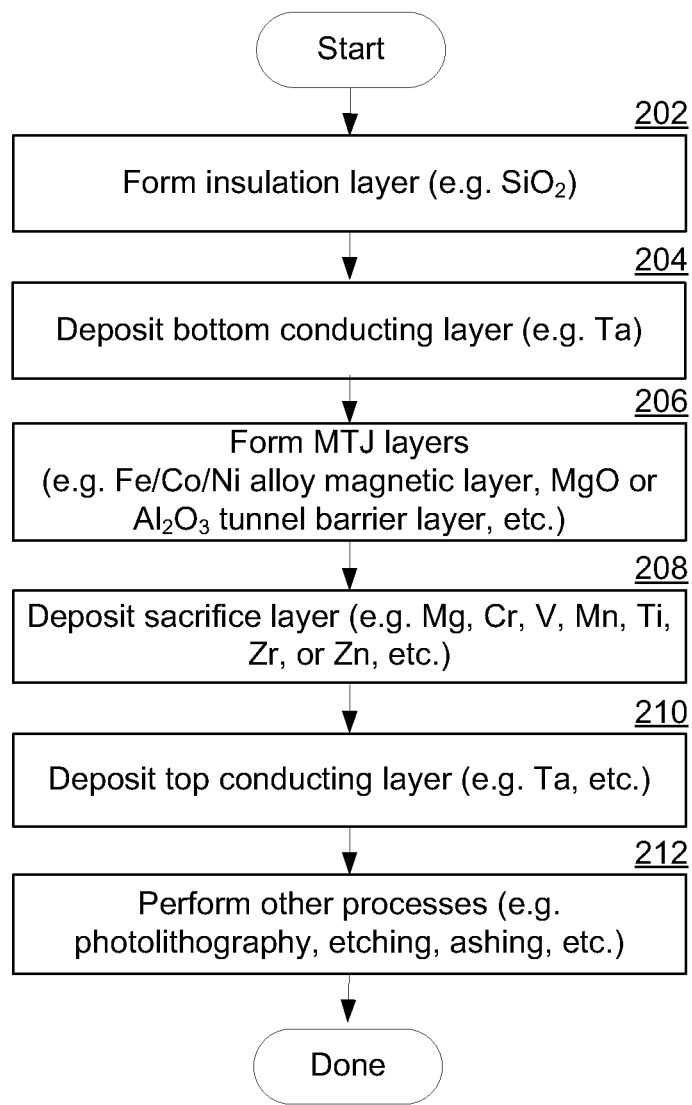
FIG. 2 illustrates a flow chart for an example process of providing a sacrifice layer for an MTJ stack according to another aspect of the disclosure.

FIG. 2 illustrates a flow chart for an example process of providing a sacrifice layer for an MTJ stack according to another aspect of the disclosure. At step 202, an insulation layer 102 (e.g. SiO$_2$) is formed. At step 204, a bottom conducting layer 104 (e.g. Ta) is deposited on top of the insulation layer 102. At step 206, MTJ layers 106 (e.g. a pinned layer & pinning layer 108, a tunnel barrier layer 110, a free layer 112) are formed on top of the bottom conducting layer 104 by depositing each layer of MTJ 106. For example, the pinned layer & pinning layer 108 can be Fe/Co/Ni alloy (pinned layer) with PtMn (pinning layer), the tunnel barrier layer 110 can be MgO or Al$_2$O$_3$, and the free layer 112 can be Fe/Co/Ni alloy. At step 208, a sacrifice layer 114 (e.g. Mg, Cr, V, Mn, Ti, Zr, Zn or alloy combination) is deposited on top of the free layer 112. At step 210, a top conducting layer (e.g. Ta) is deposited on top of the sacrifice layer 114. At step 212, other processes are performed, e.g. photolithography, etching, ashing, etc. to define the MTJ size and shape.

Figure 3:
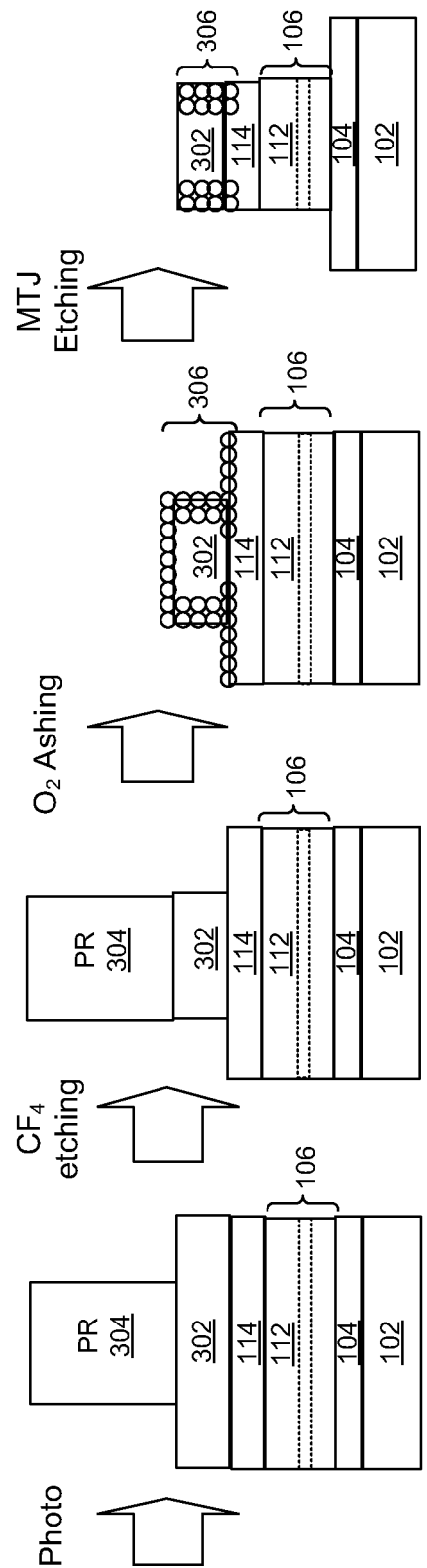
FIG. 3 illustrates an example process of MTJ etching using a sacrifice layer according to one aspect of the disclosure.

FIG. 3 illustrates an example process of MTJ etching using a sacrifice layer according to one aspect of the disclosure. An MTJ cell including an insulating layer 102 (e.g. SiO$_2$), a bottom conducting layer 104 (e.g., Ta), an MTJ 106 including a pinned (e.g. Fe/Co/Ni alloy layer) & pinning layer (e.g. PtMn) 108, a tunnel barrier layer 110, a free layer 112 (e.g. Fe/Co/Ni alloy layer), a sacrifice layer 114, a top conducting layer 302 also has a photoresist 304 layer for photolithography. After photolithography that defines the top conducting layer 302 pattern, tetrafluoromethane (CF$_4$) etching is performed to remove the photoresist 304.

The remaining organic material is removed by O$_2$ ashing that leaves oxidized layer 306 including the surface of the top conducting layer 302 and the sacrifice layer 114. The sacrifice layer 114 protects the free layer 112 in the MTJ 106 from being oxidized. Afterwards, the sacrifice layer 114 and MTJ 106 shape is defined by the MTJ etching. FIG. 3 shows just one example process of MTJ etching using a sacrifice layer according to one aspect of the disclosure. There could be many different embodiments of the process using different photolithography, etching, and ashing techniques as well as different materials without departing from the spirit and scope of the invention. A skilled person in the art will appreciate that there can be many embodiment variations of this disclosure.

The advantageous features of the present disclosure include preventing the formation of dead layer in MTJ free layer, not increasing the total resistance of MTJ, and increasing the yield of MRAM cell. The sacrifice layer will not form a dense oxide layer even after the etching process, and the total resistance will not be increased, thus the writing voltage will not be increased. Also, the MTJ with a sacrifice layer will increase yield dramatically, especially for STT-MRAM.

Although the present disclosure and its advantages have been described in detail, it should be understood that various changes, substitutions and alterations can be made herein without departing from the spirit and scope of the invention. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A magnetic tunnel junction (MTJ) cell structure, comprising:
    an MTJ stack including a first magnetic layer, a second magnetic layer, and a tunnel barrier layer in between the first magnetic layer and the second magnetic layer, wherein the first magnetic layer comprises an antiferromagnetic pinning layer and a pinned layer; and
    a sacrifice layer adjacent to the second magnetic layer, wherein the sacrifice layer thickness is between 5 Å and 400 Å;
    wherein the sacrifice layer is configured to protect the second magnetic layer in the MTJ stack from oxidation during an ashing process.

2. The MTJ cell structure of claim 1, wherein the sacrifice layer is made of at least one of Mg, Cr, V, Mn, Ti, Zr, Zn, or any alloy combination thereof.

3. The MTJ cell structure of claim 1, wherein the sacrifice layer is multi-layered.

4. The MTJ cell structure of claim 1, further comprising a top conducting layer adjacent to the sacrifice layer.

5. The MTJ cell structure of claim 4, wherein the top conducting layer is made of Ta.

6. The MTJ cell structure of claim 1, wherein the second magnetic layer is made of Fe/Co/Ni alloy.

7. The MTJ cell structure of claim 1, further comprising a bottom conducting layer adjacent to the first magnetic layer.

8. The MTJ cell structure of claim 7, wherein the bottom conducting layer is made of Ta.

9. The MTJ cell structure of claim 7, further comprising an insulating layer adjacent to the bottom conducting layer.

10. A process to manufacture a magnetic tunnel junction (MTJ) cell structure, comprising
    forming an MTJ stack including a first magnetic layer, a second magnetic layer, and a tunnel barrier layer in between the first magnetic layer and the second magnetic layer;
    depositing a sacrifice layer over the MTJ stack, wherein the sacrifice layer is capable of protecting the second magnetic layer in the MTJ stack from oxidation during an ashing process; and
    forming the first magnetic layer in the MTJ stack directly in contact with a bottom conducting layer.

11. The process of claim 10, wherein the sacrifice layer is made of at least one of Mg, Cr, V, Mn, Ti, Zr, Zn, or any alloy combination thereof.

12. The process of claim 10, wherein the sacrifice layer is multi-layered.

13. The process of claim 10, wherein the sacrifice layer thickness is between 5 Å and 400 Å.

14. The process of claim 10, further comprising depositing a top conducting layer over the sacrifice layer.

15. The process of claim 14, wherein the top conducting layer is made of Ta.

16. The process of claim 10, wherein the second magnetic layer is made of Fe/Co/Ni alloy.

17. The process of claim 10, further comprising depositing the bottom conducting layer over an insulating layer prior to forming the first magnetic layer in the MTJ stack over the bottom conducting layer.

18. A process to manufacture a magnetic tunnel junction (MTJ) cell structure, comprising
    forming an insulating layer;
    depositing a bottom conducting layer over the insulating layer;

forming an MTJ stack including a first magnetic layer, a second magnetic layer, and a tunnel barrier layer in between the first magnetic layer and the second magnetic layer;

depositing a sacrifice layer over the MTJ stack, wherein the sacrifice layer is capable of protecting the second magnetic layer in the MTJ stack from oxidation during an ashing process; and depositing a top conducting layer over the sacrifice layer, wherein the top conducting layer is made of Ta.

19. The process of claim 18, wherein the sacrifice layer is made of at least one of Mg, Cr, V, Mn, Ti, Zr, Zn, or any alloy combination thereof, and has a thickness is between 5 Å and 400 Å.

20. The MTJ cell structure of claim 1, wherein the antiferromagnetic pinning layer comprises PtMn.

\* \* \* \* \*